(12) United States Patent
De Santis et al.

(10) Patent No.: US 10,658,364 B2
(45) Date of Patent: May 19, 2020

(54) METHOD FOR CONVERTING A FLOATING GATE NON-VOLATILE MEMORY CELL TO A READ-ONLY MEMORY CELL AND CIRCUIT STRUCTURE THEREOF

(71) Applicants: STMICROELECTRONICS INTERNATIONAL N.V., Schiphol (NL); STMICROELECTRONICS S.R.L., Agrate Brianza (IT)

(72) Inventors: Fabio De Santis, Milan (IT); Vikas Rana, Noida (IN)

(73) Assignees: STMICROELECTRONICS S.R.L., Agrate Brianza (IT); STMICROELECTRONICS INTERNATIONAL N.V., Schiphol (NL)

( * ) Notice: Subject to any disclaimer, the term of this patent is extended or adjusted under 35 U.S.C. 154(b) by 0 days.

(21) Appl. No.: 15/908,575

(22) Filed: Feb. 28, 2018

(65) Prior Publication Data
US 2019/0267380 A1   Aug. 29, 2019

(51) Int. Cl.
| | |
|---|---|
| H01L 27/105 | (2006.01) |
| H01L 27/11521 | (2017.01) |
| G11C 29/00 | (2006.01) |
| H01L 27/112 | (2006.01) |
| H01L 27/11519 | (2017.01) |
| H01L 27/11558 | (2017.01) |

(Continued)

(52) U.S. Cl.
CPC ........ *H01L 27/1052* (2013.01); *G11C 29/006* (2013.01); *H01L 27/1122* (2013.01); *H01L 27/1124* (2013.01); *H01L 27/11519* (2013.01); *H01L 27/11521* (2013.01); *H01L 27/11558* (2013.01); *G11C 16/0433* (2013.01); *H01L 22/00* (2013.01)

(58) Field of Classification Search
CPC . G11C 11/005; G11C 16/0433; H01L 27/112; H01L 27/115
See application file for complete search history.

(56) References Cited

U.S. PATENT DOCUMENTS

| | | | |
|---|---|---|---|
| 5,550,072 A | * | 8/1996 | Cacharelis .......... H01L 27/0611 257/E21.689 |
| 8,693,256 B2 | | 4/2014 | Pasotti et al. |

(Continued)

*Primary Examiner* — Matthew L Reames
*Assistant Examiner* — John A Bodnar
(74) *Attorney, Agent, or Firm* — Seed Intellectual Property Law Group LLP

(57) ABSTRACT

According to principles as discussed herein, an EEPROM cell is provided and then, after testing the code, using the exact same architecture, transistors, memory cells, and layout, the EEPROM cell is converted to a read-only memory ("ROM") cell. This conversion is done on the very same integrated circuit die using the same layout, design, and timing with only a single change in an upper level mask in the memory array. In one embodiment, the mask change is the via mask connecting metal 1 to poly. This allows the flexibility to store the programming code as non-volatile memory code, and then after it has been tested, at time selected by the customer, some or all of that code from a code that can be written to a read-only code that is stored in a ROM cell that is composed the same transistors and having the same layout.

19 Claims, 8 Drawing Sheets

(51) Int. Cl.
*G11C 16/04* (2006.01)
*H01L 21/66* (2006.01)

(56) References Cited

U.S. PATENT DOCUMENTS

2003/0161184 A1* 8/2003 Lee .................. G11C 11/005
 365/185.3
2009/0296447 A1* 12/2009 Verhaar .............. H01L 27/112
 365/72

* cited by examiner

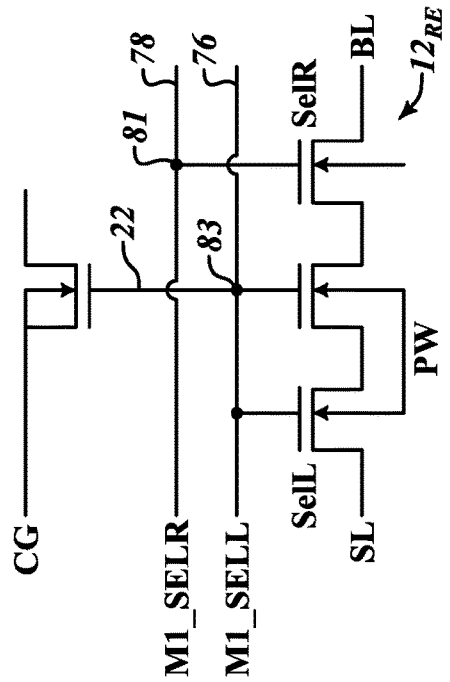
FIG.4A
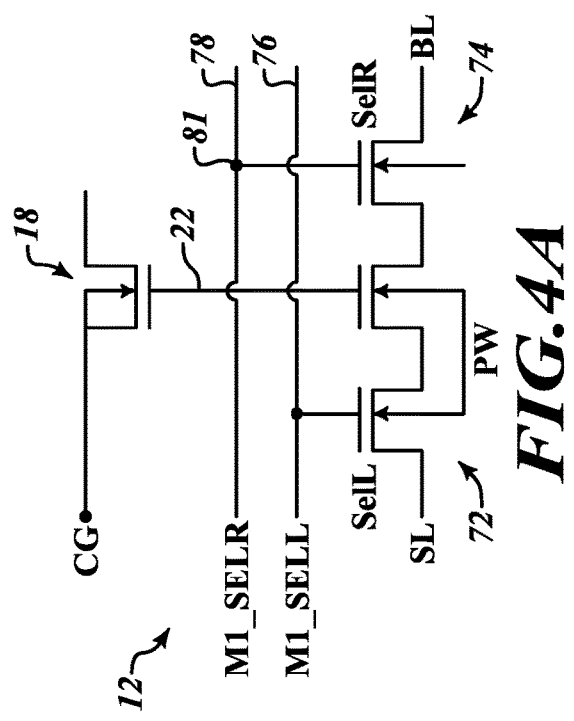
FIG.4C
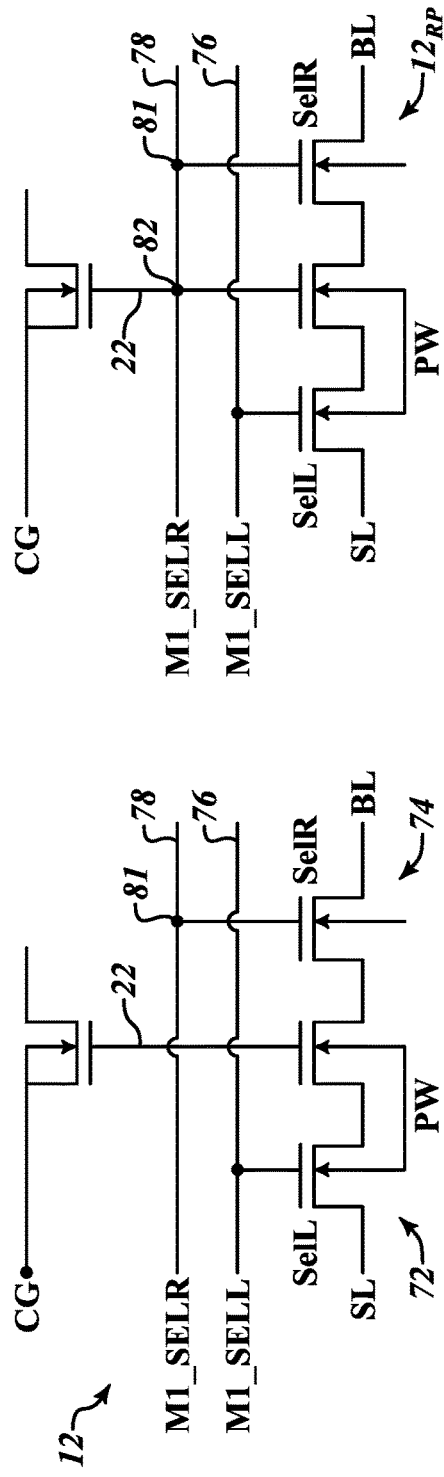
FIG.4B
FIG.4D

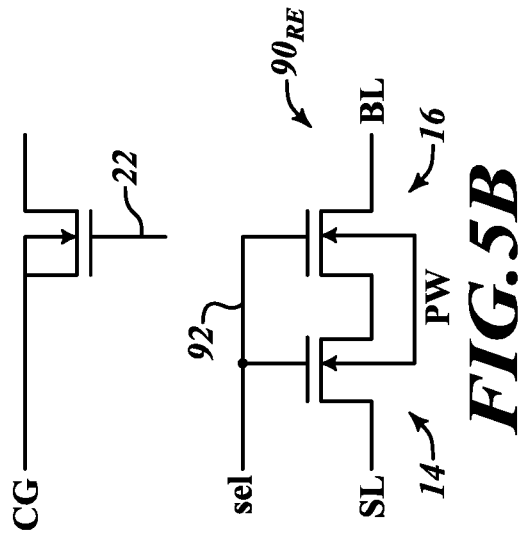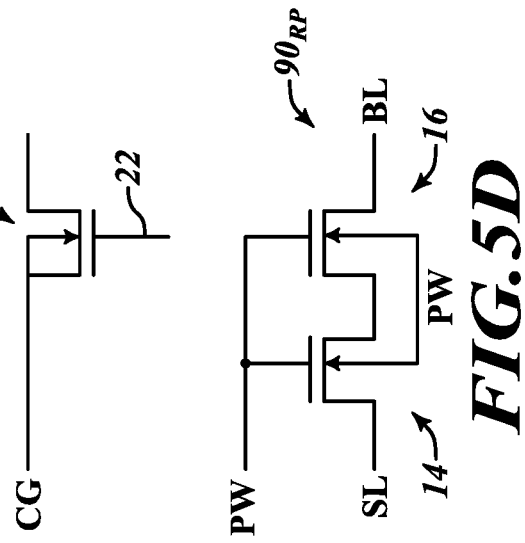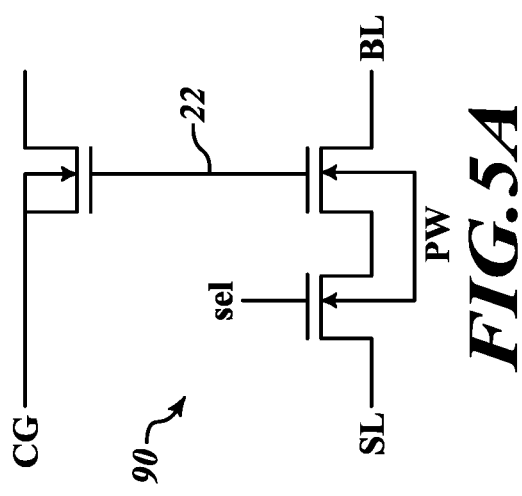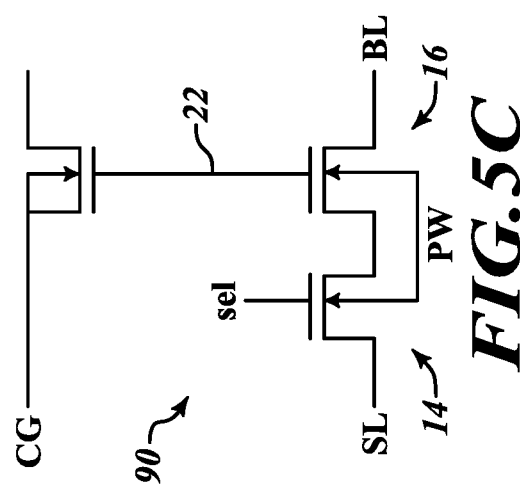

METHOD FOR CONVERTING A FLOATING GATE NON-VOLATILE MEMORY CELL TO A READ-ONLY MEMORY CELL AND CIRCUIT STRUCTURE THEREOF

BACKGROUND

Technical Field

This disclosure is in the field of converting a non-volatile memory into a read-only memory ("ROM") and, in particular, the use of a single mask to convert a code programmed into a non-volatile memory array into a ROM code using a single mask.

Description of the Related Art

There are many circuit applications where the product demands that a non-volatile memory, such as an EEPROM, be used during the initial phase of product development and during the first part of the testing and even use in the field. For example, automobiles, elevators, microcontrollers, and various other task specific ASIC chips have a section of stored memory which controls the program operation. During the initial phase of the operation development, this memory must be written to, the algorithm tested, and then revised a large number of times. Once the code is confirmed as accurate and final, then the non-volatile memory is replaced with a read-only memory ("ROM"). This ensures that there can be no mistakes in the programming and that the code is not further modified. This is particularly beneficial in microcontrollers that are used in high production machines, such as automobiles, building controls, aircraft, and the like. Accordingly, there is a wide use of circuits in which a microcontroller has a section which is initially a writeable memory, usually stored as a non-volatile memory, such as an EEPROM, and then, once the code is finalized after it has been tested in the field and proven accurate, this must be stored in a ROM so it cannot be changed or an error in programming cannot occur.

In the present state of the art, when the non-volatile memory is replaced by a ROM, this requires a complete change of the full mask set for the microprocessor. Since most ROMs have a significantly different layout and cell design than an EEPROM or other non-volatile memory, there is a significant impact on the entire layout and floor plan of the entire semiconductor die. This causes changing in the design structure, the timing of signal transfers throughout the die, for example due to changes in line lengths and interfaces, and further integration between different parts of the die. Thus, merely changing the non-volatile memory circuit to a standard ROM sometimes requires a complete integrated circuit chip redesign and layout, which has very high expense, may take a few months, and may unfortunately propagate errors in the redesign because new layouts are required with new timing for the clock signals to each part of the circuit and other changes.

BRIEF SUMMARY

According to principles as discussed herein, using the exact same architecture, transistors, memory cells, and layout, a non-volatile memory is converted to a read-only memory ("ROM"). This conversion is done on the very same integrated circuit die using the same layout, design, and timing with only a single change in an upper level mask in the memory array. This allows the flexibility to store the programming code as either non-volatile memory code, and then at the timing selected by the customer can convert some or all of that code from a code that can be written to a read-only code that is stored in a ROM.

According to principles of the disclosure as taught herein, a layout is provided for an EEPROM structure that provides the non-volatile memory. Programming code can be written to the memory cells of the EEPROM structure to generate a logic "1" or a logic "0" and store this in the individual memory cells according to the desired software code, which controls the operation of the microcontroller. The desired code is written for the microcontroller and it is tested in numerous potential operational modes during the development and early stages of product generation. The maker of the die, as well as the customer, is able to program the desired code into the EEPROM structure and operate it according to different scenarios in order to ensure that the code operates correctly under all possible conditions that the produce might encounter during use under control of the microcontroller. After the code has been confirmed to be correct and accurate in all conditions, then the data of that code is stored in the very same identical structure as a read-only memory code. In particular, the structure which formerly was an EEPROM, floating gate structure, is converted to become a ROM structure and the code is permanently written into the structure as firmware. That section of memory is changed from an EEPROM to a ROM, with the final code stored in that ROM as a hardwired code of "1"s and "0"s that can only be read, but can never be changed, because the data is stored in the form of actual physical connections inside the individual memory cells.

According to one proposed solution, the memory array can be divided into two or more sections, a first section can be modifiable so that part of the array is not converted into a ROM version, but remains as an EEPROM. This section of the memory array has the advantage and flexibility that the application can still be modified, and the code can be changed. Thus, the code that controls the system operation can be further changed in this section of the memory and permit possible further tuning of the microcontroller operation while the product is being used in the field. The second section of the memory may have the code completely frozen therein. Namely, a part of the EEPROM memory is converted to a ROM version of memory which has the code stored in hardware within the memory and can never be changed. The EEPROM can have two or more sections which remain as writeable memory and two or more sections in which the structure of the memory is converted into a ROM in which the code is frozen and can only be read and no further modifications are possible.

According to the principles as taught herein, a non-volatile memory is converted to a ROM by changing a metal mask which is at an upper metal layer. In particular, a standard EEPROM array is constructed on the die in silicon. The code which is desired to be tested is programmed into the EEPROM, with cells being programmed as "1"s or "0"s. After the code has been confirmed as accurate, then a single metal mask is changed to hardwire the floating gate of the EEPROM to different voltage levels, to create a ROM, depending on whether the cell has been programmed to a "1" or to a "0." If the particular memory cells is programmed to a "1," then the metal mask is modified for that particular cell to hardwire connect the gate of the floating transistor to the gate of the selection transistor. This metal coupling ensures that particular bit will always store a logic level "1." On the other hand, if it is desired to store a logic level "0" in the cell, which is an erased cell, then the same metal mask has a contact placed to connect the floating gate to the P-well to which the body of the floating gate is connected. This ties the floating gate to the P-well which is the body of the storage transistor and, thus, permanently stores a "0" in that particular memory cell. This permits the code stored in the EEPROM to permanently stored in the very same memory cells, which are converted from being EEPROM cells to ROM cells.

BRIEF DESCRIPTION OF THE SEVERAL VIEWS OF THE DRAWINGS

FIGS. 4A and 4B illustrate an alternative embodiment of an EEPROM cell that is converted to a ROM cell permanently erased, therefore storing a 0, according to principles disclosed herein.

FIGS. 4C and 4D illustrate an alternative embodiment of an EEPROM cell being converted to a ROM cell permanently programmed, therefore storing a 1, according to principles disclosed herein.

FIGS. 5A and 5B illustrate a further alternative embodiment of an EEPROM cell being converted to a ROM cell permanently storing a 0 as an erased cell, according to principles disclosed herein.

FIGS. 5C and 5D illustrate the further alternative embodiment of the EEPROM cell being converted to a ROM cell permanently storing a 1 as a programed cell, according to principles disclosed herein.

DETAILED DESCRIPTION

Figure 1:
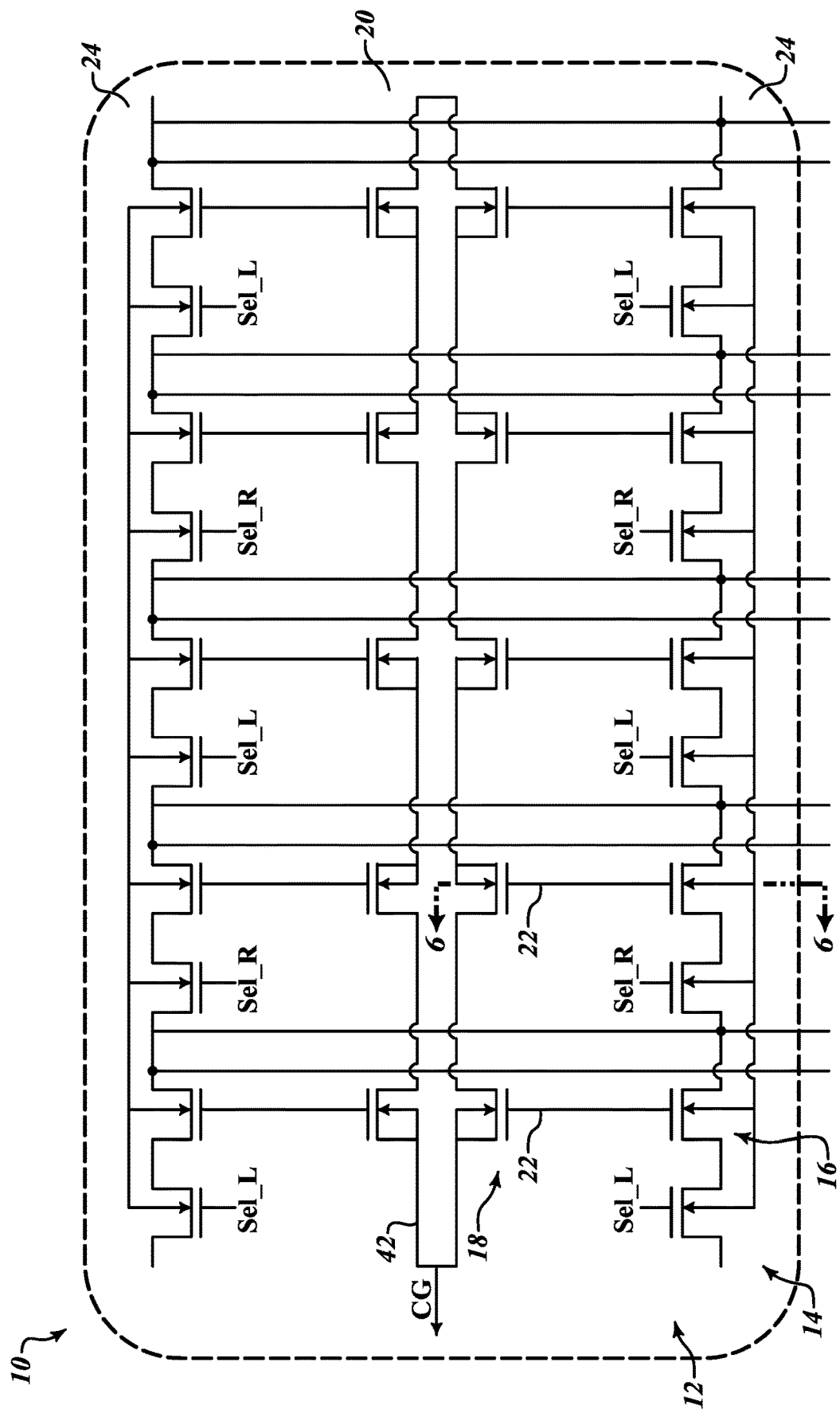
FIG. 1 is a circuit diagram of an EEPROM constructed according to principles disclosed herein.

FIG. 1 shows a circuit diagram of a non-volatile memory array. This particular non-volatile memory array is an EEPROM, though the teachings as disclosed herein can be applied to other non-volatile arrays besides an EEPROM. Within the general group of EEPROMs are included NOR flash and NAND flash, as well as other types of EEPROMs. The particular EEPROM which provides an acceptable circuit structure for use of the inventive techniques taught herein is shown and described in detail in U.S. Pat. No. 8,693,256 (the '256 patent). The '256 patent discloses a non-volatile memory array which can be integrated into a semiconductor die. Preferably, the non-volatile memory array 10 is an embedded memory array, within a microcontroller. The term "microcontroller" as used herein has the broad meaning of an integrated circuit which includes a CPU and at least two types of memory on the same integrated circuit die. One type of memory is a writable memory, which can be a DRAM, an SRAM, or an EEPROM, and the second type of memory is a non-writable memory, which is a ROM. A microcontroller is also a microprocessor. The ROM on the memory usually stores the operating code that controls the function of the microcontroller itself as well as some of the basic functions of the product in which the microcontroller is used. The microcontroller may be an ASIC that is specific to be used in heavy machinery such as automobiles, elevators, telephones, cell phones, and tablets, as well as other mechanical and transportation devices such as airplanes, ships, and entertainment devices such as TVs, stereos, and the like.

Turning to FIG. 1, the salient features of the memory array 10 will now be described, highlighting those features showing how it can be operated in the initial stages as an EEPROM, and then one or more memory cells can be converted into a ROM memory cell. More specific details of the full features of operation are described in the '256 patent, which is incorporated herein by reference in its entirety.

The memory array 10, as shown in FIG. 1, illustrates ten different memory cells, though a standard array embedded in a microcontroller will generally have many thousands of memory cells. Each memory cell 12 includes a selection transistor 14, a floating gate transistor 16, and a control gate transistor 18. In this particular design, the control gate 20 of the control gate transistor 18 is located in the P-well of the substrate, though in some embodiments, the control gate may also be a second polysilicon level or a metal level which overlies the floating gate transistor 16. In the particular design shown for the memory array 10, only a single polysilicon level is used. Therefore, this design is described for a single polysilicon floating gate array. A single polysilicon level floating gate has particular features in its construction. In this feature, the floating gate is a single polysilicon layer. The control gate can either be a metal layer or, preferably, as in the current design, can be a P-well which is in the substrate, as shown later herein in FIGS. 6A-C. Having the control gate in the P-well is also shown in the '256 patent, which provides a full description of such a memory cell's operation.

Figure 6A:
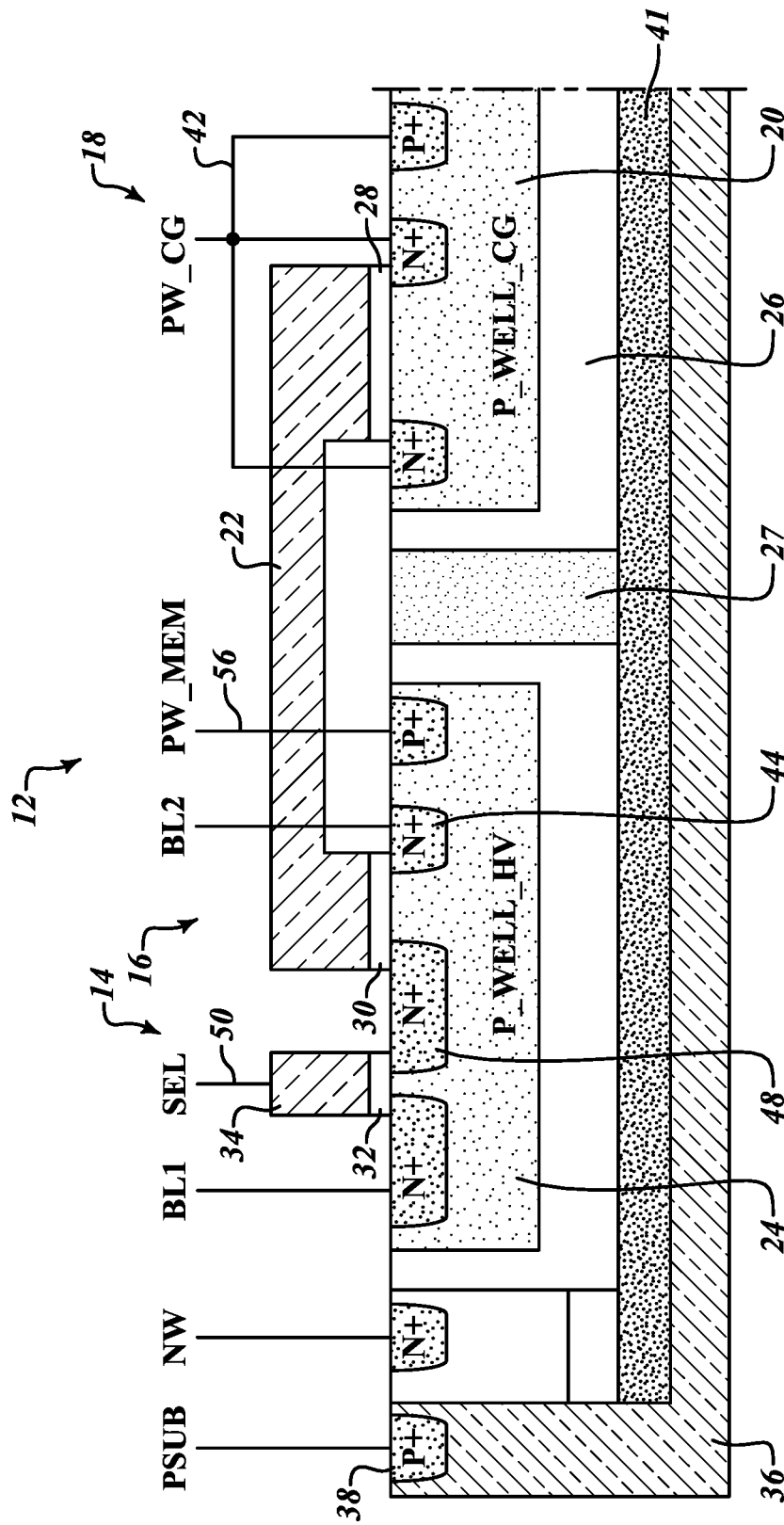
FIGS. 6A, 6B and 6C illustrate a cross-section view of an EEPROM cell as shown in FIG. 1 at location 6-6 of various alternative embodiments.
Figure 6B:
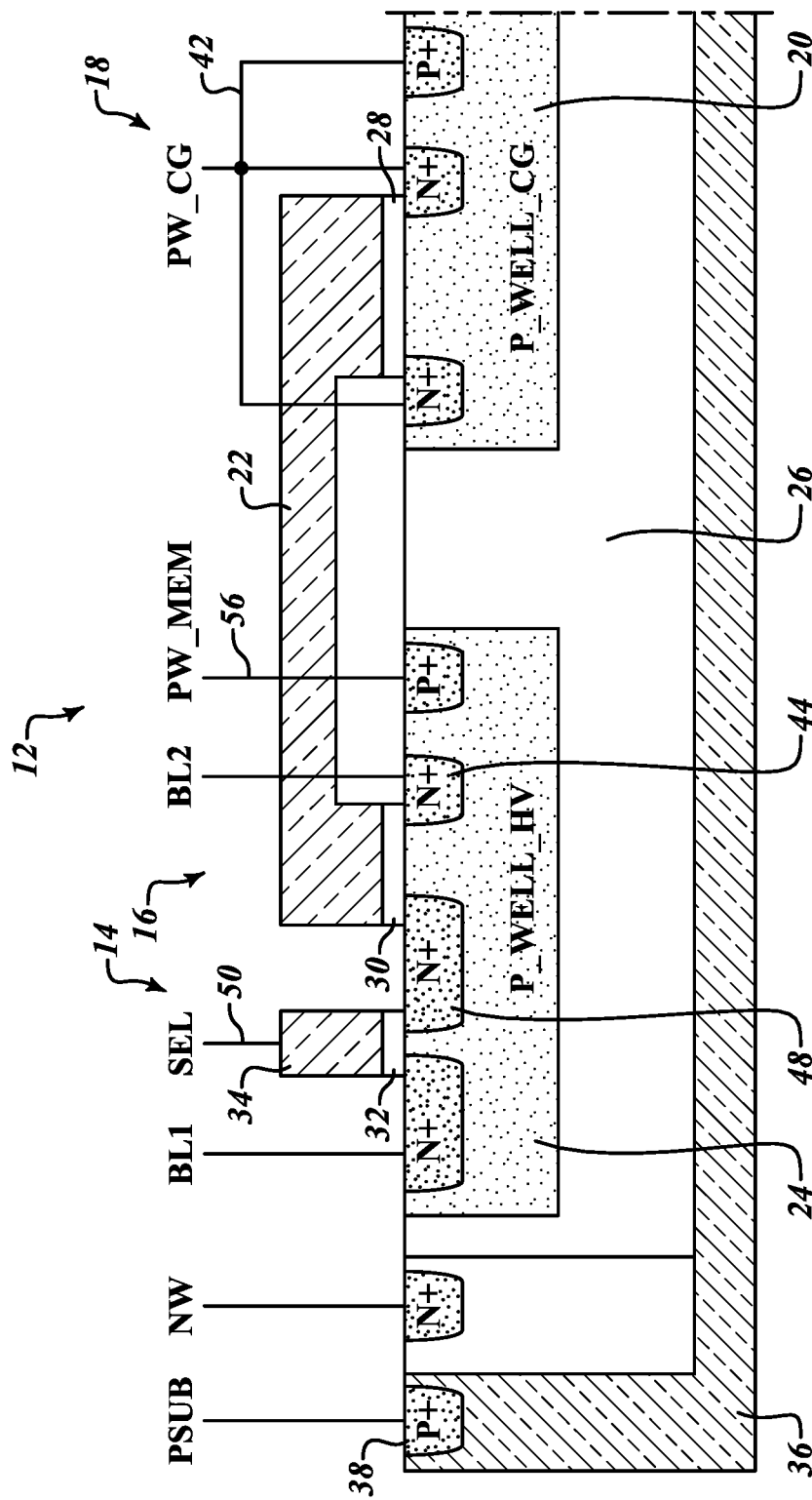
Figure 6C:
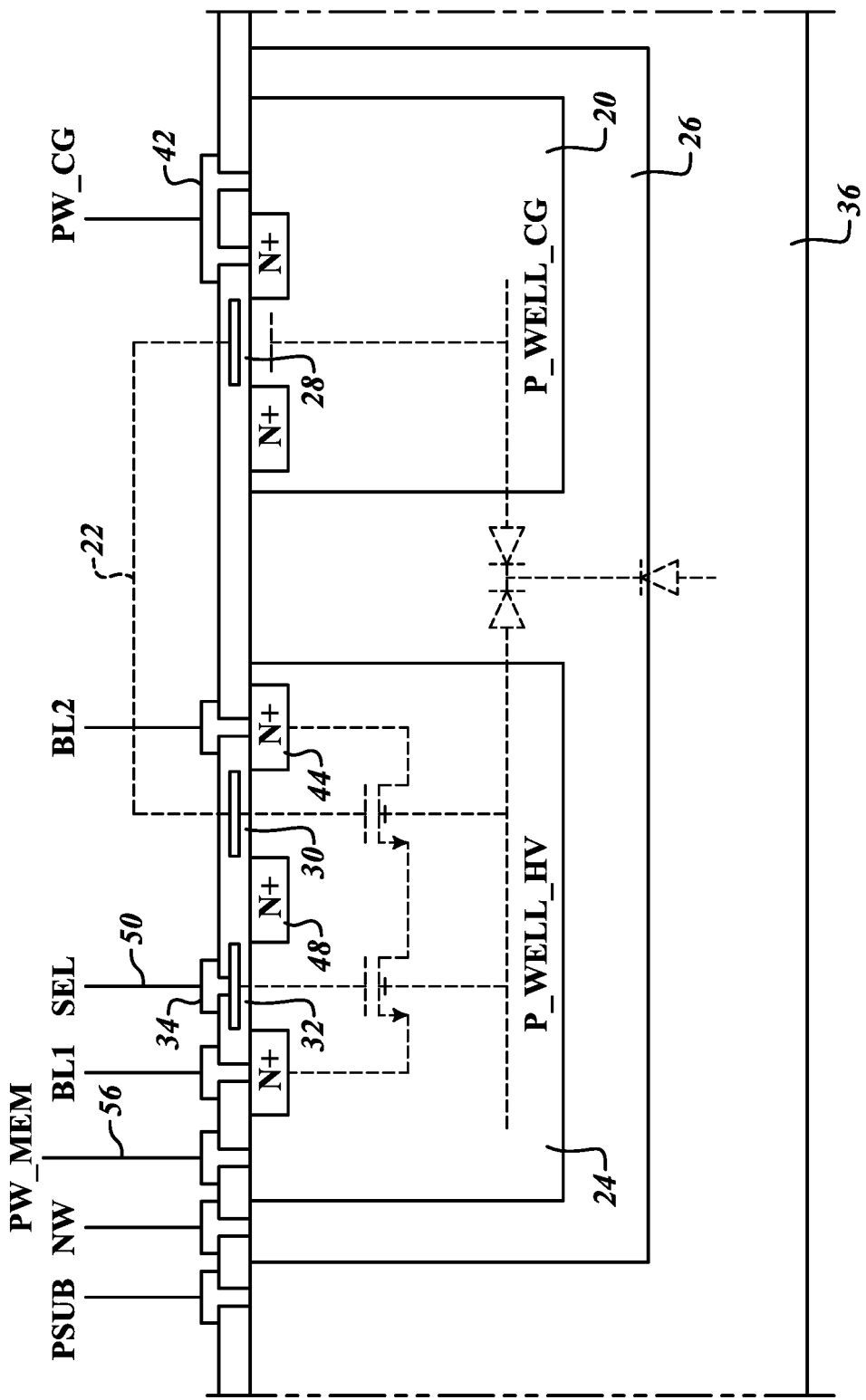

Turning now to FIGS. 6A, B and C, which are silicon representation of the memory cell 12, taken along line 6-6 of FIG. 1, they each show a single polysilicon layer as the floating gate 22. Each of FIGS. 6A-C illustrates different examples of designs to achieve the memory cell of the prior figures. As stated, they are many different EEPROM cell designs that can be used and FIGS. 6A-C illustrate three acceptable such cells. Similar structures have the same reference numbers, even though the specific parts might be somewhat different. The following description will be provided generally for FIGS. 6A-C as follows in which common reference numbers are used for generally corresponding features in each of the Figures, even though there are differences between the embodiments. The floating gate 22 extends from a position over the P-well 20 that is the control gate 20 to overlie the P-well 24 of the floating gate transistor 16 and the selection transistor 14. An electrical insulating layer 28 is positioned between the polysilicon floating gate 22 and the P-well 20 of the control gate transistor 18. An electrical insulating layer 30 is positioned between the floating gate 20 and the P-well 24 of the floating gate transistor 16 and the selection transistor 14. There is also an electrical insulation layer 32 between the P-well 24 and the gate 34 of the selection transistor 14. In some embodiments, an isolation N-type well that is heavily doped is positioned between the P-well 20 that contains the control gate and the P-well 24 which is the body of the floating gate transistor, however, this is not required and is not shown. The P-well 24 is marked in FIGS. 6A-C as the P_Well_HV and this is also the same as the PW_Well, which is as the memory Well, as can be seen by P+ contact connected to line 56, marked PW_MEM.

As can also be seen in FIGS. 6A-C, there is a substrate 36 which is a lightly doped P-type that has a P-contact 38 connected thereto. Overlying the P-substrate 36 is the N-well 26. There can be an N-type buried layer, at the lower part of N-well 26, but this is not required. Within the N-well 26 are lightly doped P-wells 20 and 24. In a preferred embodiment, the various P-wells as well as portions of the N-well 26 are epitaxially grown overlying the silicon substrate 36 as part of an epilayer.

A common line 42 electrically connects the source and the drain and the body of the control gate 42 which are electrically connected to doped regions in the P-well 20, as shown in FIGS. 6A-C. As can be seen, viewing FIGS. 1 and 6 together, this connection 42 electrically connects the source and drains of each of the control gates to a common voltage and also serves as the electrical connection to the P-well of the control gate 20. A bit line BL2 is electrically connected at heavily doped N-type region 44 to act as a source/drain region of the floating gate transistor 16 while a bit line BL1 is electrically connected to a heavily doped N-type region 46 that acts as a source/drain region for the selection transistor 14. Another source/drain region 48 extends between the selection transistor and the floating gate transistor, serving as a common source/drain region for both the selection transistor 14 and the floating gate transistor 16.

The basic principles of operation of the memory cell shown in FIG. 1 and is generally described in the '256 patent, previously introduced, can be fully understood by those of skill in the art and, therefore, the basic operation will not be repeated here. A brief explanation of the voltages on the various nodes is beneficial to understanding the operation of the memory cell and how the cell will be eventually converted into a ROM cell will, therefore, be described as follows. In a conventional single poly floating gate array, the program cell is defined as a memory cell that provides "0" current during a read operation. It is defined as "0" because it is expected that there is a charge stored on a floating gate of a programmed memory cell. Accordingly, if there is a charge stored on the programmed memory cells, this data stored in that cell is read out as a logic data value of "1." An erased cells is defined as a memory cell that can output a small amount of current during a read operation that is sufficiently different from zero current to be detected. In one example, the amount of current for an erased cell is approximately 5-10 μA of current during read operation which is stored as a logic "0," although it may be slightly different, such as 10-100 nA or some other low value that is above zero. It is expected that the floating gate of the erased memory cell is depleted of charge. Therefore, the threshold voltage is very low and current can flow from the erased memory cell. This memory cell is defined as storing a "0." Table 1 below shows the voltages on each node during a read, program, and erase step.

For purposes of this disclosure, an erased cell is defined as storing a "0" and a programmed cell is defined as storing a "1," but in some designs, an erased cell can be defined as storing a "1" and a programmed cell defined as storing a "0." Thus, while the convention used herein is that an erased cell is a "0" and a programmed cell is a "1," the convention can be reversed, by having a simple inventor at a selected location in the output of the system to change a "1" to a "0" and a "0" to a "1," or, just be deciding that a particular output, whether programed or erased, should be defined as a "1" and the other one defined as a "0," depending on the convention used for that particular design.

A doped N-type layer may be under the N-type well 26 at some or all locations, but this is optional.

TABLE 1

| Node | Read | Program | Erase |
| --- | --- | --- | --- |
| CG/PW_CG | LV | HV | 0 V |
| SEL | LV | 0 V | HV |
| BL1 | 0 V | 0 V | Floating |
| BL2 | <1 V | 0 V-IH | Floating |
| NW | LV | HV | HV |
| PW_MEM | 0 V | 0 V | HV |

As can be seen, for the EEPROM cell, as shown in FIG. 1, when a read is carried out the P-well, which is the control gate 20, is held at a low voltage, as are the select line and the N-well 26. Bit line BL1 and the P-well memory strap are held at a zero volt. Bit line BL2 is less than one volt. At this stage, data can be read out of the EEPROM cells. Voltages on the various nodes in order to perform a program are also shown in Table 1, as are the voltages at various nodes to perform an erase. The program sequence will store a "0" in the memory cell and the erase sequence will store a digital "1" in the memory cell. During a program operation, BL2 is held to 0 volts or low enough to be within the range of between 0 volts and Inhibit Voltage (IH). As can be seen, a number of the terminals have the same voltage during a particular operation. During a read operation, the P-well, select transistor, and N-well 26 are all held at the same voltage, which is a low voltage. During a program operation, the control gate 20 and the N-well 26 are both held at a high voltage and the nodes of select, BL1, and P-well memory are held at "0" voltages. During a program, the value provided on BL2 should be approximately zero volts. While the voltage might be slightly higher than zero volts, it should always be below the high voltage divided by three in order to ensure that a "0" is stored on the memory cells floating gate. During an erase cycle, BL1 and BL2 are left floating while the select line, N-well 26, and P-well memory strap are taken to a high voltage and the control gate is taken to zero volts.

A review of table 1 shows that during both a Program and Erase operation, the SEL and PW_MEM nodes both have the same voltage as each other, respectively. Thus, a ROM cell can be created since the SEL and PW_MEM are the same as each other for both data states. For a Program operation, both nodes are held low, to zero volts. Therefore, if both nodes are permanently connected to a low voltage with a hardwire connection, this will have the effect of creating a ROM cell that is programmed. Thus, when these two lines are tied to each other with a hardwire connection at metal 1, they will be connected to zero volts or low to create a Programmed ROM cell. For an Erase operation, both SEL and PW_MEM nodes are held high, to a high voltage, HV. Therefore, if both nodes are permanently connected to a high voltage with a hardwire connection, this will have the effect of creating a ROM cell that is Erased.

The EEPROM array as shown in FIG. 1 would be preferably be provided in a microcontroller and the operational code to control the microcontroller itself, as well as key aspects of the machine being operated by the machine being operated by the microcontroller can be stored in this EEPROM. During early stages of the microcontroller and product development, it is desired to be able to write different code and data values into the memory cell in order to test the operation of the microcontroller and the product under various conditions. After the code has been proven correct to provide proper operation of the microcontroller and the product under all conditions, it is desired to freeze the verified code into a ROM version. Freezing the code into the ROM version has the benefit that a future potential error of the data stored in the EEPROM cell is avoided. In addition, further writing of data to the EEPROM cell is no longer needed and reading data out of a ROM is usually faster than reading data out of an EEPROM. Accordingly, the present disclosure provides a method to convert a previously verified code that has been stored in EEPROM to be stored in the very same exact memory cells, however, having the data stored as read only. The memory cell address buffers and clock lines remain the same as well. This is accomplished by converting the EEPROM memory array cells into a ROM.

According to principles of the present disclosure, the very same data cell which previously stored the bits as "1"s or "0"s is converted to permanently store that very same data bit as either a "1" or a "0." This particular embodiment has the benefit that all the circuit locations remain the same so the sequence for the timing of reading out the data will be exactly the same as was provided with the code when stored as an EEPROM. Specifically, when the memory cell is converted from an EEPROM to a ROM memory cell, the resistance of each of the lines will remain the same, as will the length of the travel path to and from the memory cells for the various signals so no changes are made to the locations of any line or circuit. Accordingly, no additional testing time is needed because it can be assured that the data being read out of the ROM will occur on the same timing sequence that the data was previously stored in the EEPROM. Further, because the EEPROM uses the very same silicon and transistor connections, there will be no change in the timing of the data as it is read out of the various data cells, either with respect to other data or with respect to other clocks and sequences that may be occurring on the microcontroller at the same time data is being read out.

Normally, freezing of code which was previously stored in a nonvolatile memory was typically addressed by a complete substitution of the nonvolatile memory with a fully new memory array that was organized as a ROM instead of an EEPROM. In particular, according to the techniques of the prior art, the EEPROM memory array on the microcontroller was removed and replaced with a standard ROM array which permanently stored the code which was now frozen. The drawback was that the substitution of the previous EEPROM with a new ROM version required a number of mask changes for the entire array. Such a change also changed the floor layout because of the different profiles between an EEPROM and a ROM cell. Further, the substitution required an entirely new system-on-chip design validation, because different interfaces, timing sequences, and protocol were present in the ROM cell than had been present in the EEPROM. This, therefore, increased the risk that additional errors might occur in the microcontroller operation, even the code had been frozen. Accordingly, in some cases rather than convert the data code from the EEPROM version to the ROM version, the EEPROM was left in place, with the same data stored on it, and it was treated as if it were a ROM, but, in fact, it remained an EEPROM.

According to the proposed solution as provided herein, with only a single contact mask change, the EEPROM physical structure is converted into a ROM. The memory cells that formally stored a logic "1" and a logic "0" according to the most recent approved data code in the EEPROM array are stored in the very same cells and the cells are converted to ROM cells, which permanently store a logical "1" and a logical "0." According to one alternative embodiment, the EEPROM memory array can be operated as two different sections. A first section can remain modifiable and continue to operate as an EEPROM. In the modifiable part, that part of the array is not converted to a ROM version and the cells remain EEPROM cells. This section of the memory provides the advantage and flexibility for the system in that further testing may be carried out with different code stored in the portion of the array that remains an EEPROM cell. In addition, further tuning may be carried out in the field or after some time of product operation to permit additional code to be stored in the this section of the EEPROM array. At a later time, additional EEPROM cells can be converted to ROM cells. According to this embodiment, a second section, section 24a of the array has the code fixed therein by converting section 2 of the array into ROM memory cells (see FIG. 2).

Figure 2:
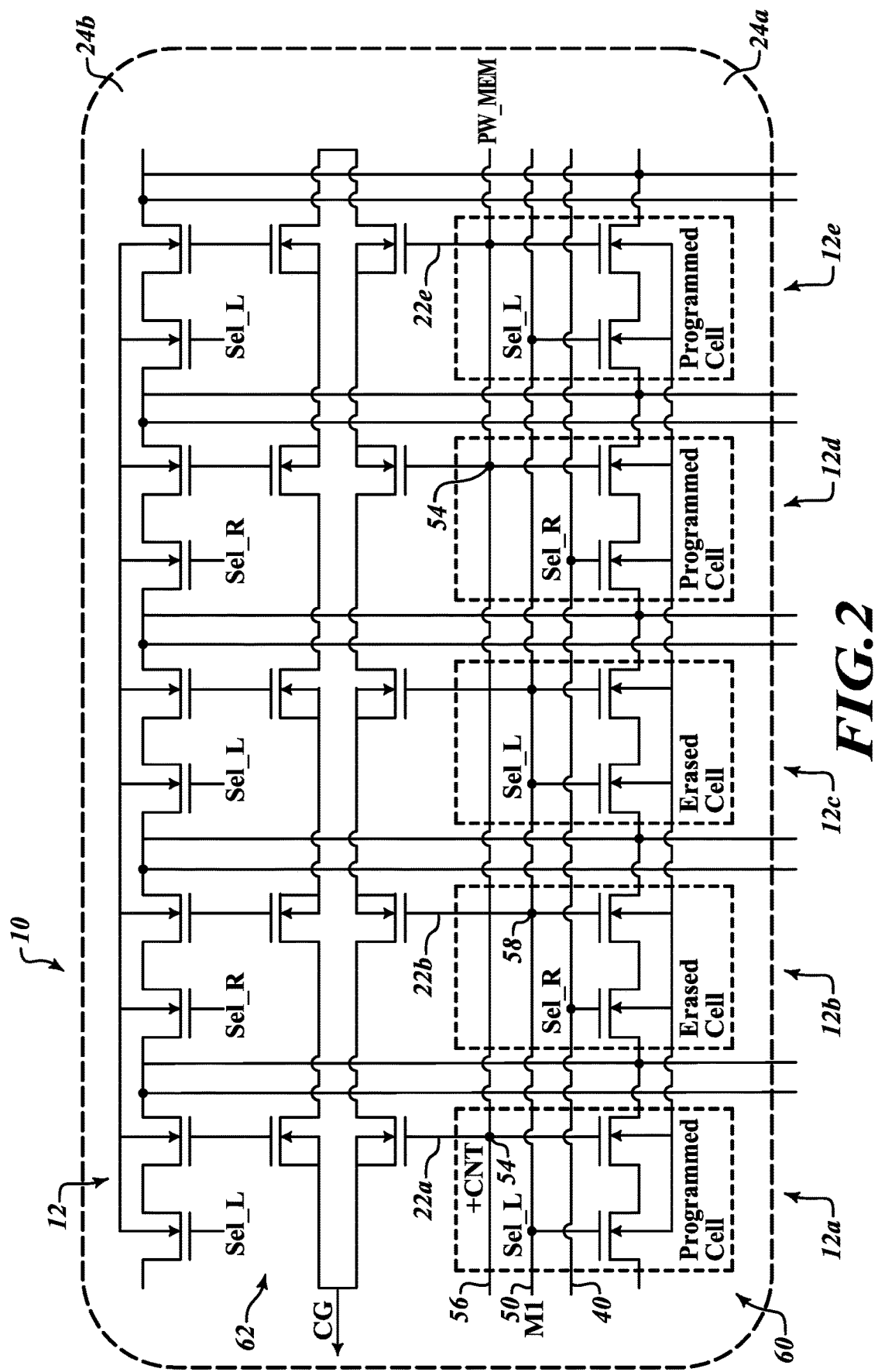
FIG. 2 is a circuit diagram of a portion of the EEPROM array converted into a ROM, while a portion remains an EEPROM according to principles taught herein.
Figure 3A:
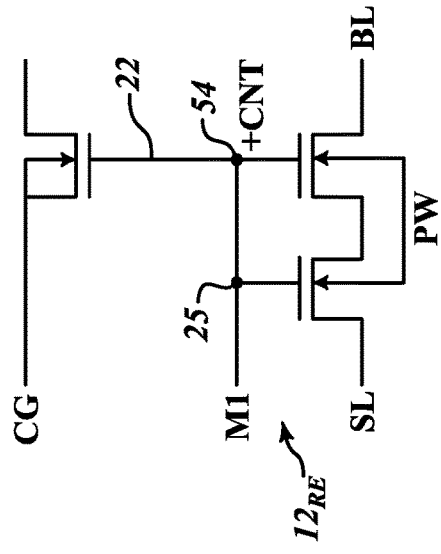
FIGS. 3A and 3B illustrate converting a standard EEPROM cell to be an ROM cell, permanently erased, therefore storing a 0, according to principles disclosed herein.

The technique by which an EEPROM cell is converted to a ROM cell will now be described as shown in FIG. 3A-3D according to a first embodiment. FIG. 3A shows one example of a memory cell 12 as shown in FIG. 1. In the standard microcontroller, a first metal layer will be provided that overlays the transistors in silicon. This first metal layer is not shown in FIG. 1, for clarity, but is shown in FIG. 2 for array section 24a. It is conventionally well known in the art to provide a series of metal interconnecting layers above various insulation layers over the semiconductor substrate. The first metal layer is normally known as metal 1, subsequent metal layers are known as metal 2, metal 3, or often listed as M1, M2, M3, and so forth. The first metal layer, M1 will be a wiring layer that provides electrical interconnection between various transistors in the microcontroller, including the CPU. It will also provide electrical interconnections to read and write data into the memory cell array 10, as shown in FIG. 1. This first metal layer M1, as part of its standard connection, will have a wiring layer 50 which has a contact 52 that electrically connects metal layer M1 to the select line of the select transistor 14. It will also have wiring lines 6. There will be an insulating layer that overlays the polysilicon floating gate 22 when the memory cell is organized as an EEPROM to separate it from the M1 lines 50 and 56.

In particular, when the single poly floating gate memory cell as an EEPROM is converted to an erased ROM cell, the floating connection to the control gate is maintained, but a local contact 54 is added onto the floating gate 22 and this is connected to the selection transistor 14. In some embodiments, the P-well control gate driver connection will be permanently deselected for that particular transistor. Namely, the control gate will remain floating in the entire row for which the transition has been made to convert the cell from the EEPROM cell to an erased ROM cell. The selection line will then be one the selection bit line path which will be held active with the selection transistor held ON and the storage transistor 16 also held ON and active.

Figure 3B:
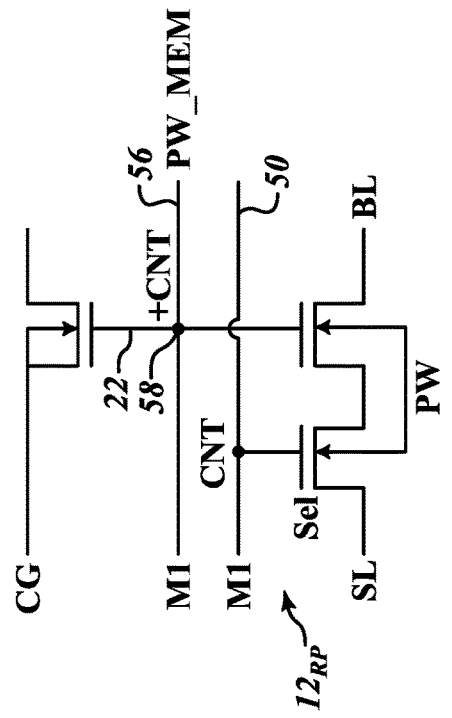

After the code has been confirmed to be correct and is desired to be permanently stored, if the particular cell is planned to store a "0" then a change is made to the contact mask for metal 1 in order to electrically connect the line 50 to the floating gate 22 to provide a new contact 54 as shown in FIG. 3B. This is shown by the text +CNT, meaning to add a contact at this location. Electrically connecting the select transistor to the floating gate will convert the memory cell into an erased ROM cell that permanently stores a "0" in the ROM cell. Namely, the ROM cell will be programmed to always be on and, thus, to output a small current whenever the ROM cell is accessed.

Figure 3C:
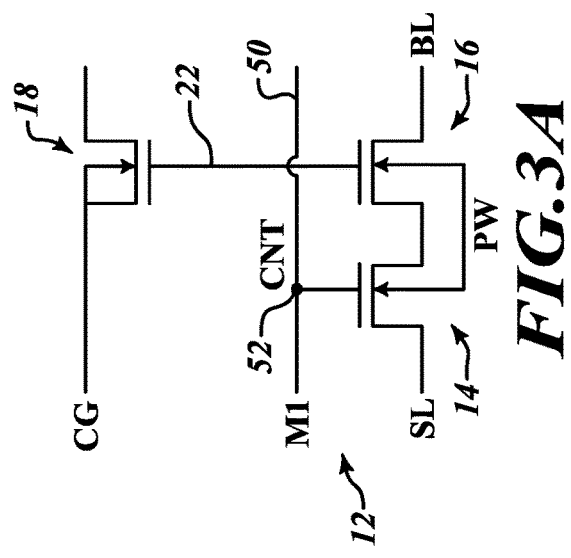
FIGS. 3C and 3D illustrate converting a standard EEPROM cell to be a ROM cell permanently programmed, therefore storing a 0, according to principles disclosed herein.
Figure 3D:
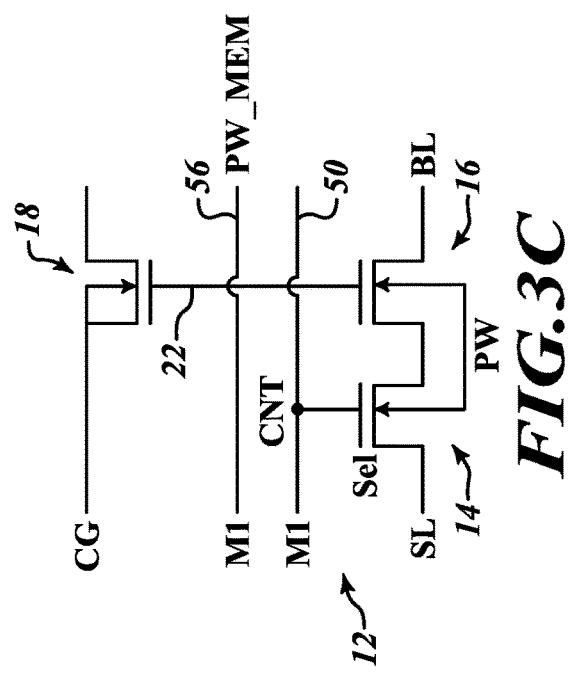

FIG. 3D illustrates the change to be made if it is desired to store a logical "1" in to the memory cell when it is converted to a programmed ROM. In particular, as shown in FIG. 3C, the metal wiring layer 56 of M1 which extends parallel to the metal wiring layer 50 also overlying the floating gate 22. This additional metal line 56 is present in one embodiment in the structure of FIG. 3A, but is not shown in order to provide more clarity. Namely, the metal mask layer between FIGS. 3A and 3C is identical and the metal lines 40, 50 and 56 are present as in the standard EEPROM cell in one embodiment. When it is desired to convert the EEPROM cell of FIG. 3C into a ROM that is programmed and stores a logical "1," the contact mask is changed to provide a contact 58 between metal line 56 and the floating gate 22, as shown by the text +CNT. This metal line 56 is electrically connected to the P-well 20, labeled PW_MEM in Table 1 and shown in FIGS. 6A-C. Since the metal line 56 is electrically connected to the P-well memory, when a contact is made to the floating gate 22 then the EEPROM cell is converted to a ROM cell which is permanently programmed and, therefore, stores a logical "1."

Namely, when the single poly gate cell is converted to a programmed ROM cell, the connection of the floating gate 22 to the control gate 20 is maintained, but a local contact 58 is added that will connect the gate of the control transistor 18 to metal line 56 which is permanently connected to the P-well of the control transistor 18. Namely, the metal strap 56 is routed to be connected to the P-well. In this change, the P-well of the control gate is also deselected so that the control gate 20 remains floating in the entire row. Since the P-well is held at ground at all times during the read cycle, then the select bit line path is never active and the storage transistor 16 can never turn on and is, therefore, held in the permanently OFF position storing a data value of "0."

Accordingly, by changing a single mask, the contact mask between M1 and polysilicon level 1, the EEPROM cell can be converted to a ROM cell and can also be selected to store either a "1" or a "0" depending on where the contact is made. Changing the contact mask between metal 1 and polysilicon level 1 is a low cost change that requires only a single mask in the process. Further, no changes are required in any of the layout of the memory cell and no additional wiring layers are required.

FIG. 2 shows the proposed memory array which is has one section 24a converted from an EEPROM array to a ROM array. In particular, the memory cell array 10 of FIG. 2 has had a portion 60 of the array 10 converted from the EEPROM cells to ROM cells and a portion 62 of the array 10 maintained as EEPROM cells. This conversion has been carried out by changing the contact mask in the manner shown and described with respect to FIGS. 3A-3D. In particular, a first memory cell 12a has been converted from an EEPROM cell to a program cell storing a "1" by placing a contact between metal layer 56 and floating gate 22. Similarly, memory cell 12e has been converted from an EEPROM cell to a programmed ROM cell by making the contact between its floating gate 22e and the metal line 56. The memory cells 12b and 12c have been converted from EEPROM cells into ROM cells which store a logical "0," namely as erased cells by providing a contact 54 from metal line 56 to the floating gate of each respective cell 12b and 12c as shown in FIG. 2. Section 60 of the memory array 10 can thereafter be addressed and the data read out as a ROM array and there is no further need to program data into that section of the memory cell array 10 because the code has been permanently written into the memory cells of that section of the memory by the change in the contact mask. On the other hand, section 62 of the memory cell 10 remains an EEPROM memory cell and data can be continued to be written into and read from section 62 of the memory cell 10. Wiring layer M1 forms lines 40, 50 and 56 that connect to various nodes in the memory cell 12. Wiring line 50 connects to the gates of the selection transistors 14 for the Sel_L transistors and wiring line 40 connects to the gates of the selection transistors 14 for the Sel_R transistors.

In the embodiments shown in FIGS. 1 and 2, the P-well for the control gate 20 can be the same P-well and, thus, be selected to be floating when the memory cell is converted into a ROM cell. As shown in FIG. 2, and as is also apparent from FIGS. 6A-C, the P-well 24a of the floating gate transistor of the first memory section is electrically isolated from the P-well 24b of the other section of the memory cell array. Accordingly, it is possible to provide different electrical voltages in these respective P-wells when one portion of the memory becomes a ROM and the other portion of the memory remains an EEPROM. While the memory cell array shown in FIG. 1 has a common P-well control gate 20 for both sections of the memory array, in one design the P-well 20 will be a physically separated P-well that is electrically isolated for one section of the EEPROM array than it is for another section of the EEPROM array. For example, the next pair of memory cell rows can be organized in a sideways step pattern in which the P-well 24 of the adjacent rows is shared and the P-well for the control gate is electrically isolated for that particular row from other rows. The array can be a mirror image about either the control gate P-well or the floating gate P-well. Thus, that row of the array which has an electrically isolated P-well can be selected for the different section of the memory array which can remain as an EEPROM or, alternative, can become the ROM array and other portions of the memory array can remain as EEPROMs.

FIG. 6A has the additional features of a buried N-Well 41 and further heavily N-doped isolation region 27. These provide additional noise protection and can reduce parasitic current in some designs. FIG. 6B is an example of more basic cell layout and is acceptable in many situations. FIG. 6C has a few different features and corresponds generally to FIG. 5 of U.S. Pat. No. 8,693,256 which has been previously introduced and is incorporated herein by reference.

According to principles as taught herein, the nonvolatile is replaced by a ROM by changing only a single mask in the array. Thus, by using the same architecture and exact same layout, a circuit which starts as a nonvolatile can be easily converted to a ROM. This allows the flexibility of the customer to store the code for the microcontroller either in a nonvolatile memory or in a ROM. This proposed integration can be used for many different types of EEPROMs. Three examples of different EEPROMs have been provided and, as can be appreciated, different EEPROM memory cells may use the principles as taught herein and by using a single mask be converted from an EEPROM to a ROM memory cell. In various embodiments as discussed herein, the contact mask which provides the contact from the metal to the polysilicon line is the mask which is changed in order to convert the cell from an EEPROM to a ROM cell. Alternatively, and as discussed in one embodiment herein, the single mask which is changed could also be the polysilicon etch mask. Alternatively, it could also be the metal 1 etch mask. The proposed integration as discussed herein, therefore, provides for only very few changes in the actual location of contacts and does not change the actual layout and, therefore, does not impact the timing of the delivery of data to other circuits on the same die and does not require an entire redesign of the CPU systems of the die based on the memory cell being in a different location or having different distances for the signal propagation to travel. In some embodiments, in which it is anticipated that the EEPROM will be converted to a ROM, the routing of the metal wiring line that is the P-well strap is selected to have a local routing that will extend over the floating gate so that a new contact can be provided for those memory cells in which it is desired to convert them to a ROM cell. In addition, many different types of EEPROM cells may be used beyond those which are specifically shown herein and, using the principles as taught herein, can be converted from EEPROM cells to ROM cells.

FIGS. 4A-4D show a further alternative embodiment for converting an EEPROM memory cell into a ROM cell having data permanently stored therein. FIG. 4A shows a different design for an EEPROM memory cell 70 which has two selection transistors, a selection transistor left 72 and a selection transistor right 74. It has a polysilicon floating gate of the type previously shown and described with respect to FIGS. 1 and 6. The memory cell shown in the second embodiment is, therefore, somewhat different in operation; however, to those skilled in the art its operation can be easily understood based on the descriptions provided herein as a standard EEPROM cell of a type known to be used in microcontrollers. In the EEPROM cell as shown in FIG. 4A, the first metal layer M1 contains two selection lines to select the EEPROM cell during reading and writing. A first metal line 76 is connected to the left selection transistor 72 and a second metal line 78 is connected to the right selection transistor 74. These connections permit reading and writing data to the memory cell 70. Any desired data bit value can be written to the memory cell by selectively activating the different transistors and applying the voltages to store either a "1" or "0." After the code has been confirmed as accurate, and it is desired to freeze the code, then the EEPROM cell shown in FIG. 4A can be converted into a ROM cell which can selectively store either a "1" or a "0." If it is desired to store the data bit as a permanent "0" so that the ROM cell becomes an erased ROM cell, then the contact mask is changed to electrically connect the left selection transistor at a contact location 83 to the floating gate 22 as shown in FIG. 4B. This electrically connects the left selection transistor to the floating gate and permanently changes the memory cell to an erased ROM cell. On the other hand, if it is desired to change the EEPROM cell to a permanently programmed ROM cell to permanently store a logical "1" therein, then the contact mask is changed to provide a contact 82 which electrically connects the right selection transistor gate to the floating gate 22 by making an additional contact on metal line 78, as shown in FIG. 4D. Therefore, with the different EEPROM cell of the type shown in FIGS. 4A and 4C, it is possible to, again with a change to a single mask, the metal 1 to polysilicon contact mask, convert an EEPROM cell to a ROM cell which permanently stores the desired logical data bit, whether a "1" or a "0."

FIGS. 5A-5D show yet a different type of EEPROM cell and a different technique by which a single mask can be changed in order to permanently store a "1" or a "0" into the ROM cell. In this different memory cell 90, the floating gate 22 extends from the control gate to the storage transistor 16 in a manner similar to that previously described. In this particular memory cell layout, the metal line M1 may not be present at this location in the memory cell, or it could be present, depending on the desired design parameters. If it is desired to convert the memory cell of FIG. 5A into a ROM cell which is permanently erased, then the polysilicon mask is changed to have a new configuration. In the new polysilicon mask configuration, the gate of the storage transistor 16 is electrically connected via the polysilicon layer to the gate of the selection transistor 14 using a polysilicon strap 92. As part of this mask change, the electrical connection between the controlled transistor 18 is removed so that there is no electrical connection between the control gate 20 and the floating gate previously present as floating gate 22. Therefore, with this single change of the polysilicon level mask, the EEPROM cell of FIG. 5A is permanently changed into a ROM cell which is in the erased state and, therefore, permanently storing a "0."

If it is desired to convert the EEPROM into a programmed ROM cell, then the transition from the memory cell shown in FIG. 5C is made as shown in FIG. 5D. In particular, in this conversion the same mask change is made to the polysilicon level in order to electrically connect the storage transistor 16 to the gate of the selection transistor 14. In addition, at a different location on the chip, the polysilicon line 94 is electrically connected to the P-well. The particular transistor which connects the polysilicon level 94 is not shown in FIG. 5D; however, it would be present at a location either within the memory array 10 or just outside the memory array 10 and the connection of such a polysilicon line to the P-well could be easily understood and carried out by one of ordinary skill in the art. This can be accomplished again merely by a change in the polysilicon mask which provides a connection of the polysilicon layer between the storage transistor 16 and the selection transistor 14 and also converts the polysilicon layer to be electrically connected to the P-well. In some embodiments, this may also have a change in two mask layers by the addition of a contact between the polysilicon layer and the P-well, although in other embodiments only a single mask change will be needed, namely the change in the polysilicon to extend over a contact that was previously present. Namely, the contact to the P-well can be provided at a selected location on the semiconductor die and extend to the top of an insulation layer. The shape of the polysilicon layer in FIGS. 5A and 5C when the cell is operating as an EEPROM is selected to go a different route and not overlay on this contact which is present. This could be done by having the polysilicon level terminate just prior to reaching the contact or have it in a shape such that it avoids those locations where the contact extends from the P-well up to the polysilicon layer. Then, when it is desired to freeze the code in the memory cell, the polysilicon mask is changed so that the polysilicon layer now is routed to overlap the contact to the P-well which was present in the prior contact mask. This will provide electrical connection from the polysilicon layer to the P-well and, thus, store the data as either a "1" or a "0" depending on the desired value of the code.

In another alternative embodiment, the conversion as shown in FIGS. 5A-5D can also be accomplished using a change in the metal mask layer M1. In particular, the connection lines 92 and 94, instead of being made of polysilicon, can be carried out by changing the metal 1 mask and the connections 92 and 94 made in the metal 1 interconnection lines. As part of this mask change in metal 1, a change would also be made in the polysilicon mask in order to sever the connection between the control transistor 18 and the storage transistor 16.

The various embodiments described above can be combined to provide further embodiments. All of the U.S.

patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of making a ROM cell comprising:
   forming an EEPROM cell having a floating gate, a control gate, a first well and a selection gate;
   forming a metal line overlying the EEPROM cell; and
   converting the EEPROM cell to ROM cell by forming a contact between the metal line and the floating gate, wherein the contact connects the floating gate to the selection gate.

2. A method of making a ROM cell comprising:
   forming an EEPROM cell having a floating gate, a control gate, a first well and a selection gate;
   forming a metal line overlying the EEPROM cell; and
   converting the EEPROM cell to ROM cell by forming a contact between the metal line and the floating gate, wherein the contact connects the floating gate to the first well.

3. The method of claim 1, including forming a first set of EEPROM cells and a second set of EEPROM cells, wherein forming the first set includes forming the EEPROM cell.

4. The method of claim 3 further including:
   converting the first set of EEPROM cells into ROM cells; and
   maintaining the second set of EEPROM cells as EEPROM cells.

5. The method of claim 1 further including forming a second well at the same time the first well is formed.

6. The method of claim 5 wherein the control gate is in the second well.

7. A method of forming a memory comprising:
   forming an EEPROM cell, the EEPROM cell having a well, a floating gate overlying the well, a control gate and a selection gate; and
   converting the EEPROM cell into a ROM cell, wherein the converting comprises:
   electrically connecting the floating gate to the selection gate.

8. A method of forming a memory comprising:
   forming an EEPROM cell, the EEPROM cell having a well, a floating gate overlying the well, a control gate and a selection gate; and
   converting the EEPROM cell into a ROM cell, wherein the converting step comprises:
   electrically connecting the floating gate to the well.

9. The method of claim 7 further including:
   forming a metal line overlying the EEPROM cell.

10. The method of claim 9, comprising forming a polysilicon line, wherein the converting step includes
    forming a contact between the metal line and the polysilicon line.

11. The method of claim 8, further including:
    forming a metal line overlying the EEPROM cell.

12. The method of claim 11, comprising forming a polysilicon line, wherein the converting step includes forming a contact between the metal line and the polysilicon line.

13. The method of claim 2, including forming a first set of EEPROM cells and a second set of EEPROM cells, wherein forming the first set includes forming the EEPROM cell.

14. The method of claim 13, further including:
    converting the first set of EEPROM cells into ROM cells; and
    maintaining the second set of EEPROM cells as EEPROM cells.

15. The method of claim 2, further including forming a second well at the same time the first well is formed.

16. The method of claim 15, wherein the control gate is in the second well.

17. A method of making a ROM cell, comprising:
    forming an EEPROM cell having a floating gate, a control gate, a first well and a selection gate;
    forming a metal line overlying the EEPROM cell;
    converting the EEPROM cell to ROM cell by forming a contact between the metal line and the floating gate; and
    forming a second well at the same time the first well is formed, wherein the control gate is in the second well.

18. The method of claim 1, including forming a first set of EEPROM cells and a second set of EEPROM cells, wherein forming the first set includes forming the EEPROM cell.

19. The method of claim 18, further including:
    converting the first set of EEPROM cells into ROM cells; and
    maintaining the second set of EEPROM cells as EEPROM cells.

* * * * *